US005465324A

United States Patent [19]
Lee et al.

[11] Patent Number: 5,465,324
[45] Date of Patent: Nov. 7, 1995

[54] METHOD AND SYSTEM FOR DEFINING GEOMETRIC RELATIONS IN A COMPUTER AIDED DESIGN SYSTEM

[75] Inventors: Kevin Lee, Schoenaich; Berthold Hug, Ammerbuch, both of Germany

[73] Assignee: Hewlett-Packard Company, Palo Alto, Calif.

[21] Appl. No.: 1,390

[22] Filed: Jan. 6, 1993

[30] Foreign Application Priority Data

Jan. 10, 1992 [EP] European Pat. Off. ............. 92100307

[51] Int. Cl.$^6$ .................................................. G06T 11/00
[52] U.S. Cl. .................. 395/133; 395/155; 395/159
[58] Field of Search ..................................... 395/127, 133, 395/135, 145–148, 155–161; 364/488; 345/157, 158, 159, 162

[56] References Cited

U.S. PATENT DOCUMENTS

| | | | |
|---|---|---|---|
| 4,698,625 | 10/1987 | McCaskill et al. | 345/157 |
| 4,829,446 | 5/1989 | Draney | 364/488 |
| 4,939,672 | 7/1990 | Meadows | 395/159 |
| 4,987,527 | 1/1991 | Hamada et al. | 395/127 X |
| 5,123,087 | 6/1992 | Newell et al. | 395/155 |
| 5,268,998 | 12/1993 | Simpson | 395/127 |
| 5,299,307 | 3/1994 | Young | 395/161 |

FOREIGN PATENT DOCUMENTS

| | | |
|---|---|---|
| 0421818A2 | 4/1991 | European Pat. Off. . |
| WO91/17512 | 11/1991 | WIPO . |

Primary Examiner—Almis R. Jankus

[57] ABSTRACT

A computer aided design system assists the user in defining and editing geometric objects. It proposes several useful geometric relations between the cursor position and the already defined geometric object independent of the cursor position. The user may accept one of the proposals, or reject all of them. For example, if an already defined circle is within the catch range of the cursor position, the system proposes to draw a line from the cursor position to the center of the circle, and it proposes tangents from the cursor position to the circle.

20 Claims, 6 Drawing Sheets

METHOD AND SYSTEM FOR DEFINING GEOMETRIC RELATIONS IN A COMPUTER AIDED DESIGN SYSTEM

FIELD OF THE INVENTION

The present invention relates to a method for defining geometric relations in a computer aided design system, said system comprising a digital processor connected with at least one user input interface, preferably a keyboard, a graphics tablet or a computer mouse, and connected with a display.

BACKGROUND OF THE INVENTION

Computer aided design (CAD) systems according to the state of the art are used to create and edit mechanical parts, integrated circuits, printed circuit boards etc. in an interactive mode. That is, the user enters his input commands via a keyboard, a graphics tablet, a mouse or the like, and the created geometry is displayed on a screen like a CRT (cathode ray tube), an LC (liquid crystal) display and so on (the output device may even be a plotter or the like). The process of entering or modifying a certain geometry may be quite difficult and time-consuming. It is therefore a basic goal for the development of CAD systems to provide as much user assistance as possible, in order to save engineering time and increase the acceptance of the system.

One tool to make the generation and editing processes of geometric objects easier is the so-called "catching technique". That is, if a cursor displayed on the screen approaches a geometric object or a singular point thereof, it will be "caught" if it is within the catch range. The catch range is usually an imaginary circle surrounding the current cursor position (however, other definitions of the catch range may be used as well, like a rectangle, or a circle with context-dependent radius). Geometric objects as mentioned herein may e.g. be straight lines, circles, arcs and other kinds of geometric contours. Singular points are e.g. the endpoints or the midpoint of a line, the center of a circle, the focal point of a parabolic curve etc.

A very simple example will be described now:

Let us assume that the user has already drawn a (first) line on the screen. He may then reposition the cursor to another (new) location and instruct the system that this is the new cursor starting position. Thereafter, he may move the cursor, and whenever he enters a "draw line" command (e.g. by an appropriate keystroke), the CAD system generates a new (second) line from the new cursor starting position to the current cursor position.

If, however, the current cursor position is quite close to the line already drawn (i.e. within the catch range), the CAD system assumes that the user wanted to have the second line end on the first line, and therefore the second line is drawn from the new cursor position to a point on the first line. Similarly, if a singular point of the first line is within the catch range, the second line is drawn from the new cursor position to this singular point (e.g. an endpoint of the first line).

Although this process works, the user has no indication whether the CAD system will "trigger" on an existing geometric object or a singular point thereof; he may only observe this when the geometry has already been created. One has therefore already tried to give him some indication in advance what will happen after a "draw" command, e.g. by displaying the word "midpoint" if the midpoint of an existing line is within the catch range. Disadvantages of this known technique are that a) only singular points of existing geometry elements are taken into account; that is, the user gets no indication when a geometric element, but none of its singular points, is within the catch range;

b) the user does not know all possible singular points of an existing geometric element in advance, i.e. he does not know on which singular points he may "trigger". In contrast, he only notes by accidental appearance of a displayed singular point that he has "trapped" into it.

Other known support tools for interactive geometry specification are the so-called construction geometry elements. Elements of this type are usually used to construct points, which are subsequently used to specify the intended geometry. In other words, the construction geometry elements are auxiliary elements which are only used on a temporary basis, but do not form part of the final geometry. In practice, construction geometry elements are often used to find the intersection point between several elements. Additionally, catching may be used to correct pick points onto the construction geometry elements.

SUMMARY OF THE INVENTION

The present invention deals with a new support technique for interactive geometry specification which makes geometry input considerably easier and faster. Therefore, the acceptance of a CAD system is increased, and the required engineering time is reduced.

The invention basically includes the following steps:

identifying, retrieving or defining a geometric object, e.g. a line or a circle, identifying, retrieving or defining the position of a cursor, generating at least one geometric relation between said cursor position and said geometric object independent of said cursor position, or between said geometric object and at least a second geometric object, generating graphic representations of said cursor position, said geometric object and said geometric relation and/ or said second geometric object and feeding it to said display, and entering a selection mode for accepting said geometric relation.

This method adds an "intelligent" aspect to the geometry specification process as it anticipates what the user may want to define. Most regularly, the user does not define a line, a circle or the like which is simply somewhere in the editing area, but rather is in some context with already existing geometry (i.e. geometry which has been defined in prior steps). Therefore, the new method proposes to generate (predefined) geometric relations between the cursor position and already defined geometric objects, or between two (or more) already defined geometric objects, and offer these to the user for selection.

A method which is based on the proposition of a geometric relation between a point near the cursor and an existing object is disclosed in WO 91/17512. According to this method, a design proposal is made as soon as the cursor approaches a singular point, or a singular geometric element of the existing geometry. A second cursor is then drawn through which the proposed geometric element extends in addition to the cursor moved by the user. If the latter cursor is moved away from the singular point or geometric element, the proposed design elements disappear.

Thus, some of the steps incorporated in the present invention are already known from the WO 91/17512. However, a major disadvantage of the known device is that a design proposal is only made once the cursor approaches the singular point or element. That is, the user has no overview regarding design possibilities; in contrast, in case he desires to evaluate these possibilities, he has to move the cursor right all over the screen. Even then, he cannot see the various proposals at a glance; that is, he has to remember former design proposals. This is because the design proposal disappears, as soon as he moves the cursor away from the singular point or element.

In contrast, the present invention proposes to generate the geometric relation (design proposal) independent of the cursor position. That is, the user does not have to approach a singular point or element with the cursor before he can see the geometry proposed by the CAD system. This makes the system considerably easier to operate. In addition, there is the possibility to generate and display a multiplicity of design options at a glance, without having to move the cursor at all.

The present invention is also more advantageous than the system in WO 91/17512 in that, with the present invention, relations between two geometric objects can be proposed, regardless of the cursor position. It will be noted that the latter design choices may even be proposed if no cursor is shown on the display at all.

Another difference is that the present invention does not need a second cursor for the creation of a design proposal, such that the user is less confused.

Returning to the invention, a typical example of such a (predefined) geometric relation is a line from the current cursor position which is a tangent to an (already existing) circle. Although it is possible with prior art CAD techniques to define such a geometric relation, it is quite cumbersome, as several appropriate commands have to be entered. The present invention offers the possibility to have the geometric relation—here a line originating from the current cursor position and tangential to the circle—displayed as an option and simply to accept the proposal (e.g., by clicking a computer mouse). In a particularly advantageous embodiment, all commonly desired geometric relations are displayed; e.g., all lines from the current cursor position tangential to a circle, and through its center.

Other typical geometric relations include "parallel", "perpendicular", "coplanar", "coaxial" and "tangential". All of these relations have been accessible in prior art systems as well; however, they required the input of complex keystrokes and a lot of thought upon entry. The present invention reduces the number of explicit functions necessary to access the relations thus allowing quicker, easier and more effective geometry input.

However, there is another considerable advantage of the inventive method. Although it covers the generation of a single geometric relation as well, several relations are preferably generated. This offers the user a multiplicity of choices and may even remind him of possible relations he is presently not aware of.

The possible relations may e.g. be pre-stored in the CAD system in the form of a look-up table or the like. That is, whenever geometry is edited in interactive format and an already defined geometric object is on the screen, the look-up table is checked for possible geometric relations which apply to the present screen configuration.

The above considerations apply to 2-dimensional as well as 3-dimensional geometry input.

A preferred embodiment of the present invention can be summarized as follows:

If, during input of geometry, an already existing object is detected or selected by the user, the CAD system displays all logical relational possibilities. This proposal from the system can significantly simplify subsequent user input. The user may select one of the proposed geometries without activating a special function. The proposed geometries not selected by the user may be retained for later use.

The technique extends to multiple existing geometry elements. Here, in addition to the relations of the individual elements, relations between the elements are proposed.

The geometric relations proposed in each situation take into account:

a) The type of geometry being input, e.g. line, circle or vector.

b) The type of existing geometry to which a relationship is desired.

c) Any data already input, e.g. a first input point.

In an advantageous embodiment, the step of generating graphic representations includes the step of marking said geometric relation, preferably in a graphic representation different from the graphic representations of said cursor position and/or said geometric object. The different graphic representation of proposed geometry indicates to the user that this is not yet a defined geometry, but rather a selection which he may chose. It is understood that this increases the usability of the system further. The different graphic representation may include different colors, different thickness, dotted lines etc. Other possibilities of marking the geometric relations may be taken into account as well, e.g. by means of alphanumeric text.

The invention as described above relates to the step of identifying and marking relations between the cursor position and an already defined geometric object, or between two or more already defined geometric objects. In a preferred embodiment, however, singular points (or at least one singular point) of the existing geometric object are identified as well, and a graphic representation thereof is fed to the display. This enhances usability and user-friendliness of the CAD system further. It is understood that the proposed geometric relations may take such singular points into account, but this is not a necessary condition to practice the present invention. For example, a geometric relation not taking account of singular points is a line through the current cursor position and collinear to an existing line. On the other hand, a line through the current cursor position and the endpoint of an existing line considers a singular point, namely the endpoint of the existing line.

Preferably, if the existing geometric object is a straight line, the geometric relations include line between the cursor position and an endpoint of the straight line, line between the cursor position and the midpoint of the straight line, line perpendicular to the straight line and extending at least between the cursor position and the straight line, line through the cursor position and extending parallel to the straight line.

If, on the other hand, the existing geometric object is a circle, the proposed geometric relations may preferably include line through the cursor position and tangential to the circle, line through the cursor position and the center of the circle.

As already mentioned, geometric relations between several existing geometric objects (which do not take account of the current cursor position) may also be proposed. It is understood that the cursor position need not necessarily be identified, retrieved or defined in that case. Such geometric relations may advantageously include

- line through endpoints of two straight lines,
- line through the midpoint of a straight line and an endpoint of another straight line,
- line through the midpoints of two straight lines,
- line perpendicular or parallel to a straight line and extending through an endpoint or the midpoint of another straight line,
- line through the midpoint or an endpoint of a straight line and through the center of a circle,
- line through the midpoint or an endpoint of a straight line and tangential to a circle,
- line through the centers of two circles,
- line through the center of a circle and tangential to another circle,
- line tangential to two circles.

According to the above described embodiment of the present invention, it also relates to a computer aided design system comprising

- at least one user input interface, preferably a keyboard, a graphics tablet or a computer mouse,
- a digital processor connected to said user input interface,
- at least one display connected to said digital processor,
- an object description memory containing data on already defined geometric objects,
- a picture instruction memory for generating a pictorial representation of already defined geometric objects,
- a cursor position memory.

The user input interface receives command entries from the user, which are then fed to the digital processor. The digital processor takes the necessary information on existing (already defined) geometric objects from the object description memory and uses them to generate a pictorial representation thereof for feeding it to the display.

In this embodiment, the present invention is characterized by a preview instruction memory operatively connected with the digital processor, said preview instruction memory containing instructions for establishing predefined geometric relations between the cursor position and a geometric object, or between two geometric objects. That is, the preview instruction memory contains the necessary commands to generate the geometric relations to be offered to the user for selection, in dependence of the existing geometric objects.

Preferably, the preview instruction memory contains instructions for identifying at least one singular point of a geometric object and for generating a pictorial representation thereof. In another advantageous embodiment, the preview instruction memory contains instructions for generating a graphical representation of the predefined geometric relations different from the representation of the geometric objects.

Further features and advantages of the present invention will be apparent from the following detailed description.

BRIEF DESCRIPTION OF THE DRAWINGS

The invention will now be explained, by means of a nonlimiting example, with reference to the accompanying drawings, in which.

DETAILED DESCRIPTION OF PREFERRED EMBODIMENTS

Figure 1:
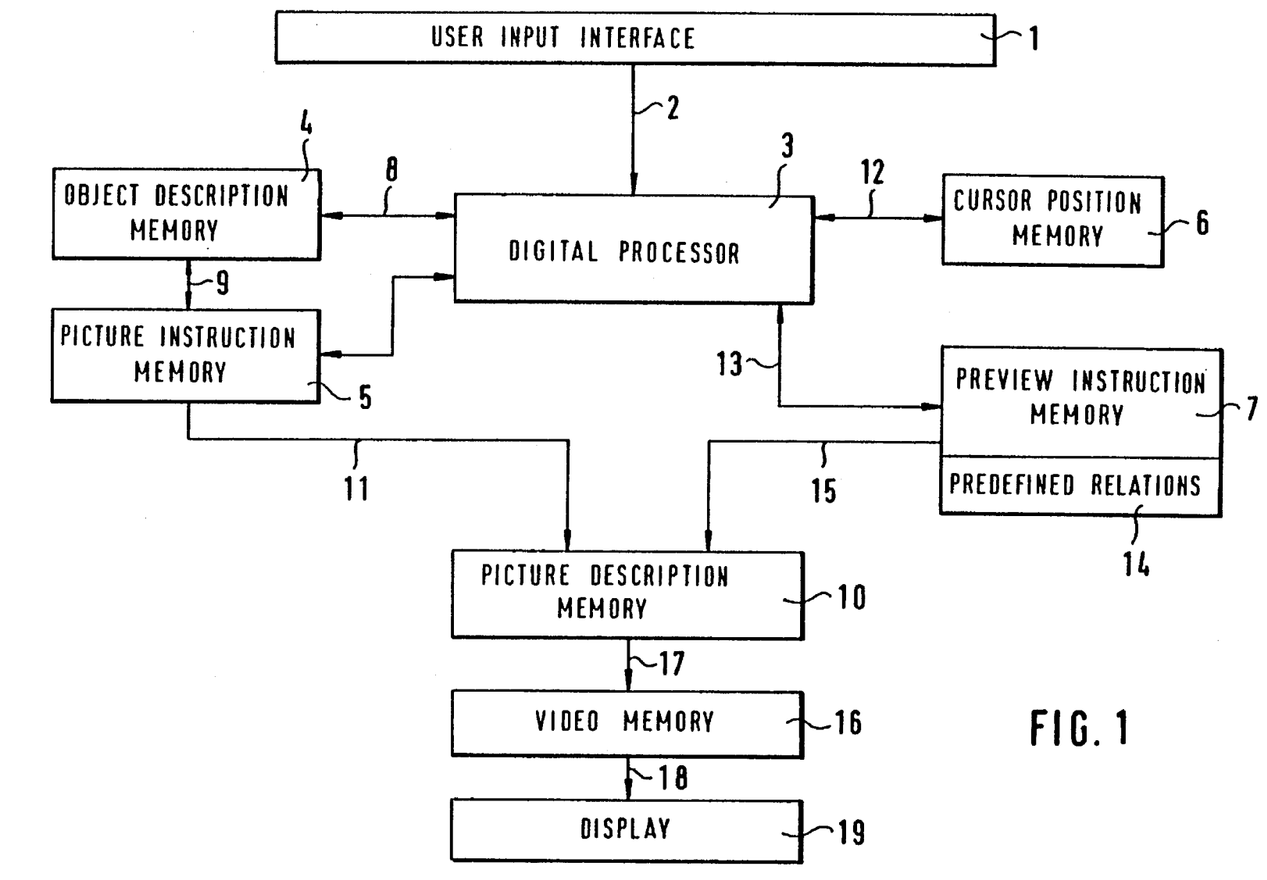
FIG. 1 is a block diagram of the major components of a computer-aided design system according to the present invention.

FIG. 1 depicts the basic components of a CAD system according to the invention. A user input interface 1 may be a keyboard, a graphics tablet and/or a computer mouse. This interface is connected—line 2—with a digital processor 3. This processor is connected with several memories, namely object description memory 4, picture instruction memory 5, cursor position memory 6 and preview instruction memory 7. The object description memory 4—connected with digital processor 3 via line 8—contains a digital description of already defined geometric objects. It is, in turn, connected (line 9) with picture instruction memory 5 which contains the necessary code for digital processor 3 to process the object descriptions stored in memory 4. That is, in contrast to object description memory 4 (which contains data), picture instruction memory 5 contains commands (also called OP codes). Digital processor 3 uses the commands stored in picture instruction memory 5 to generate a pictorial representation of the data in object description memory 4, which pictorial representation is then stored in the picture description memory 10 (line 11).

Digital processor 3 is further connected (line 12) with cursor position memory 6 which contains the actual cursor position. Another line 13 connects digital processor 3 with preview instruction memory 7. Like picture instruction memory 5, preview instruction memory 7 contains commands for execution by digital processor 3. In the specific case of memory 7, this memory contains the instructions needed to generate the "preview geometry", i.e. possible geometric relations between the cursor and already defined geometric objects (as stored in object description memory 4), or between two or more already defined objects. For this purpose, preview instruction memory 7 has access to sub-memory 14 which contains a set of predefined relations. These relations may be defined in the form of data, or in the form of commands.

When digital processor 3 executes the instructions stored in preview instruction memory 7, a multiplicity of geometric proposals is generated which are fed—via line 15—to picture description memory 10. Thus, picture description memory 10 contains information on already defined objects, as well as proposals for a supplemented geometry. The object descriptors stored in memory 10 are then used to create a direct graphical image, e.g. a bit map stored in video memory 16 (line 17). The output of video memory 16 (line 18) is fed to a display 19, e.g. a CRT.

It is understood that the block diagram of FIG. 1 depicts only the components directly related to the present invention. Other components are not shown explicitly. For example, digital processor 3 may be connected with several other memories which contain e.g. the operating system, I/O handlers and the like. Further, it is understood that not necessarily all memories shown as blocks in FIG. 1 have to be incorporated in separate components. Rather, the blocks have been drawn for the purpose of easy understanding in FIG. 1. That is, all or some of the memories shown in FIG. 1 may be realized by a single or only a few of memory components. In particular, cursor position memory 6 will not be a separate integrated circuit in practice, as only a few bits are required to describe the position of a cursor.

Figure 2A:
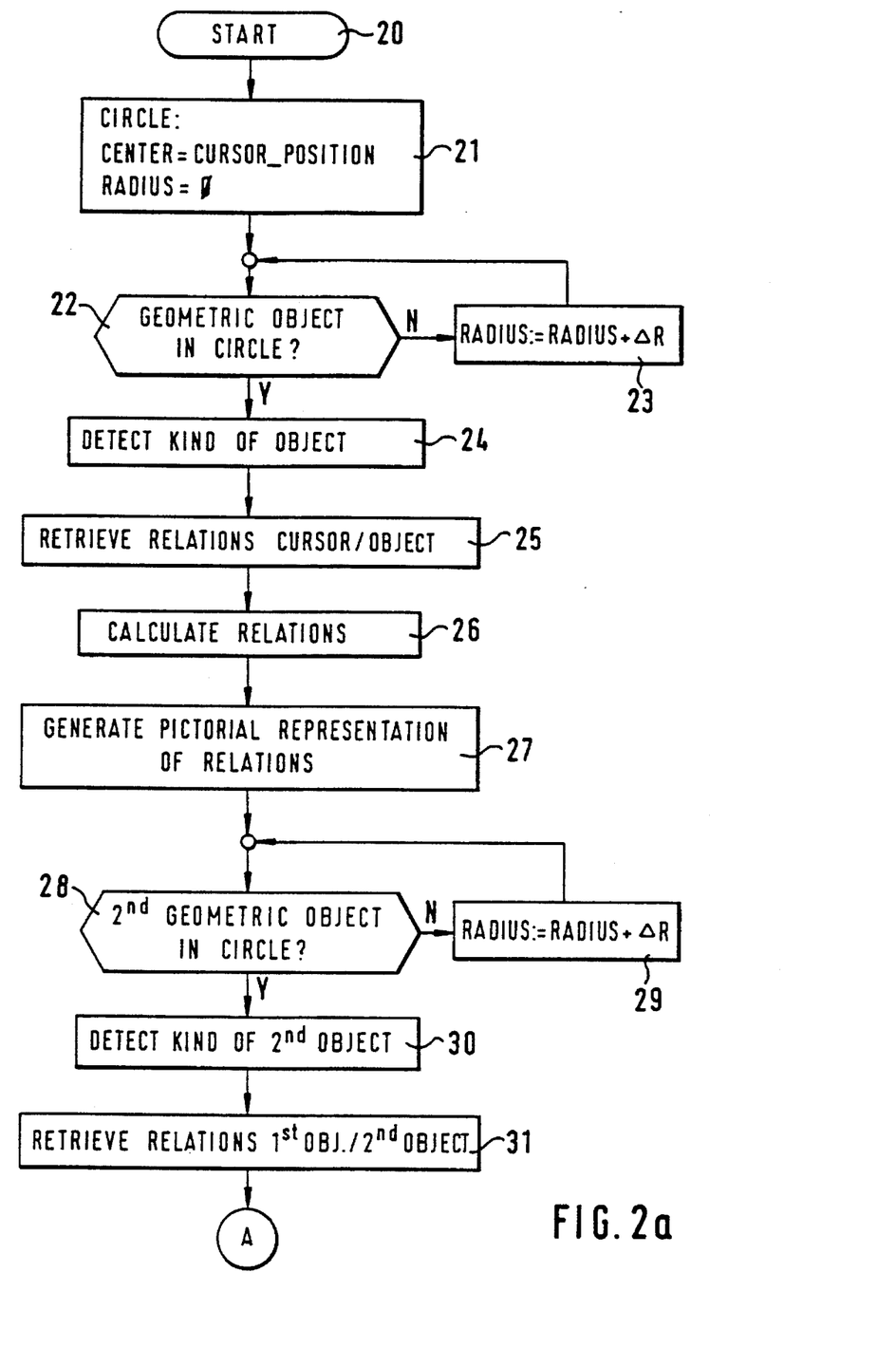
FIGS. 2a and 2b depict a flow chart of basic operation when providing "lookahead" design support.
Figure 2B:
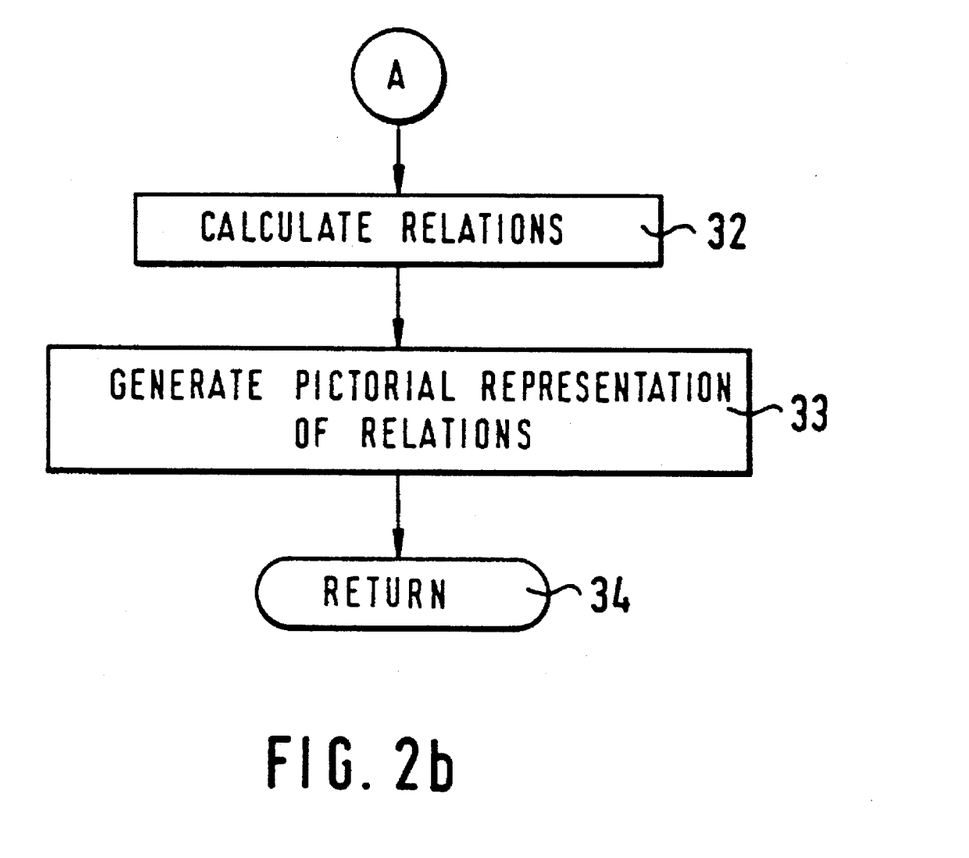

The flow chart in FIGS. 2a and 2b describes basic operation of digital processor 3 when generating a preview. The flow chart is entered at "START" label 20. In box 21, an (imaginary) circle is defined with its center at the current cursor position and a radius of zero. This is effectively the "catch range". It is understood that a radius of zero has only been chosen for the purpose of explanation here, because a catch range with radius zero would not make any practical sense. Therefore, in practice, a value slightly greater than zero would be chosen for the initial value of the radius.

According to box 22, the processor checks whether an existing (already defined) geometric object can be found in the circle which represents the catch range. If the answer is "no", the radius is increased by an increment $\Delta R$ (box 23). The check in step 22 is then repeated. (It is understood that the radius will not be increased to infinity, but that the searching process will be interrupted as soon as the radius reaches a certain maximum, usually user defined. However, for the purpose of easy explanation, this step has not been drawn in FIG. 2a).

If an already defined geometric object has been found in the circle, operation proceeds to step 24. That is, the kind or nature of the existing object (e.g. line, arc or the like) is detected. Then, the predefined relations between the current cursor position and the detected object are retrieved (step 25). This information is effectively retrieved from submemory 14 (FIG. 1).

Returning to the flow chart of FIG. 2, the next step 26 is to calculate the actual relations. For example, if the existing object has been identified as a circle, and one of the retrieved relations was a tangent from the current cursor position to this circle, then the operation performed in step 26 would be to calculate the actual tangent for the given cursor position and the given circle. Next, a pictorial representation of the retrieved and calculated relations is generated (step 27).

In step 28, the processor checks whether there is a second geometric object in the circle. If no, the radius is increased (step 29), as above, and the process is repeated. Otherwise, the kind of the second object is detected (step 30), and the relations between the first and the second existing object are retrieved (step 31).

In step 32, the relations between the first and the second object are calculated, and a pictorial representation of the actual relations is generated (step 33). Operation returns to the calling routine in step 34.

It will be noted that steps 22 to 27, and steps 28 to 33 are somewhat similar. In fact, the first sequence of steps (22 to 27) retrieves possible relations between the cursor position and a first existing object, whereas the second sequence of steps (28 to 33) retrieves relations between a first existing object and a second existing object. It will be understood that further objects, e.g. a third existing object, may be identified and used for the proposal of relations as well. However, for illustrative purposes, these cases have not been drawn in the flow chart of FIG. 2.

Figure 3:
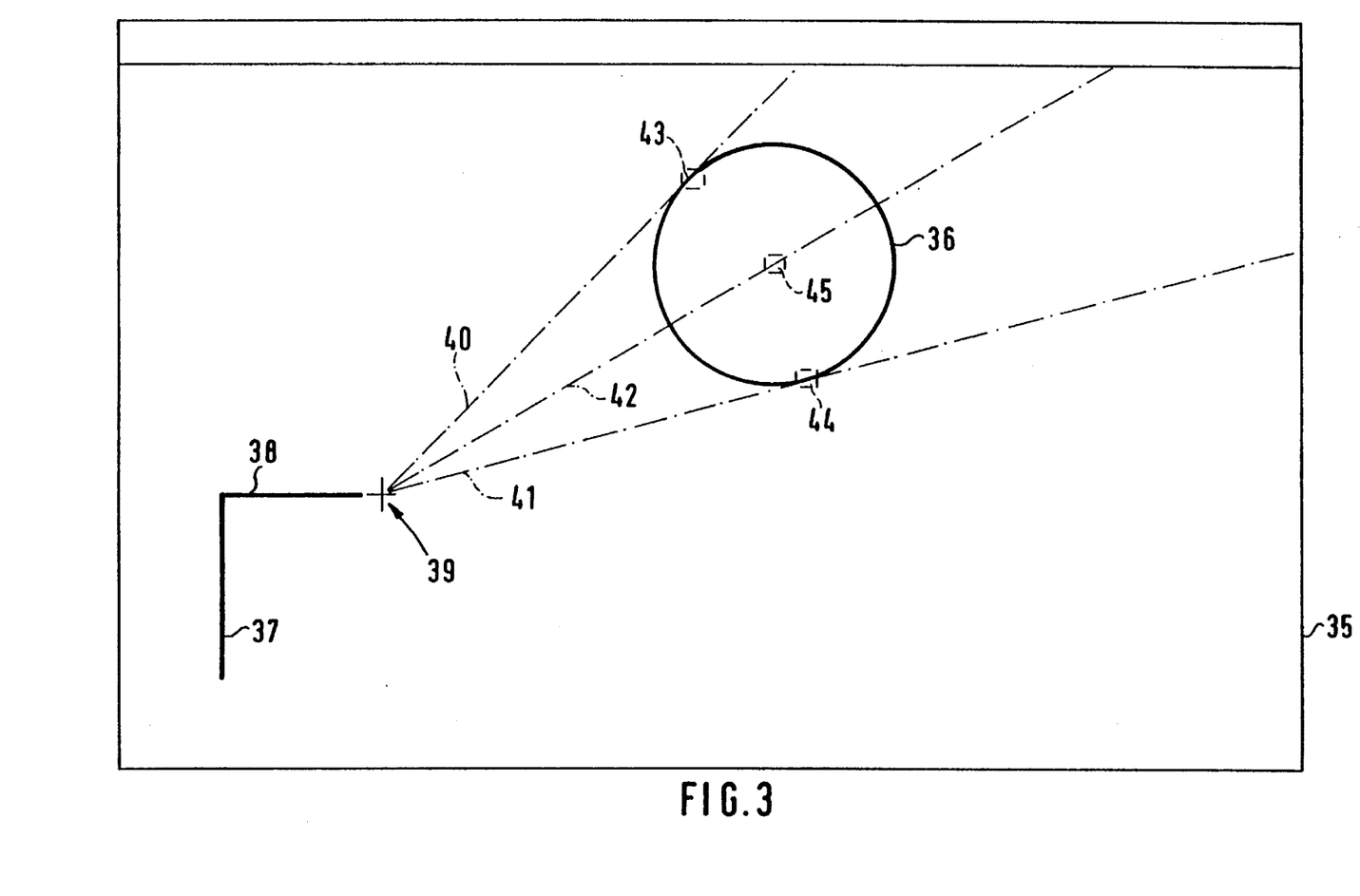
FIG. 3 depicts a display with a first example of such design support.

FIG. 3 depicts an actual screen picture of what will happen in the editing process. The screen is generally referred to as 35. A circle 36 has already been defined and drawn in a prior editing step. Likewise, lines 37 and 38 are existing geometric objects, i.e. already defined.

The current cursor position is labelled as 39. The system now searches for an already defined geometric object and finds circle 36 (line 37 and 38 are not regarded in this example; however, one could also take account of these).

A look-up table (e.g., sub-memory 14 in FIG. 1) reveals that there are three possible relations of interest between current cursor position 39 and circle 36. These are:

1. a first tangent 40;
2. a second tangent 41; and
3. a line 42 through the current cursor position 39 and the center of circle 36.

In the shown example, lines 40 to 42 are depicted as dotted lines. This is simply done to distinguish them over contours belonging to already defined objects. In practice, lines of another color or the like could be used as well.

The singular points of the geometry in question are also indicated by small boxes, namely the points of contact 43 and 44 between tangents 40 and 41 and circle 36, and the center 45 of circle 36.

Lines 40 to 42 are proposals for geometric relations which are assumed to be of possible interest to the user. The user may now, in a selection mode, identify one of these lines and instruct the system to "draw" it, i.e. to make it an existing object. Instead, the cursor may also be further moved as usual, in which case none of lines 40 to 42 is selected.

Figure 4:
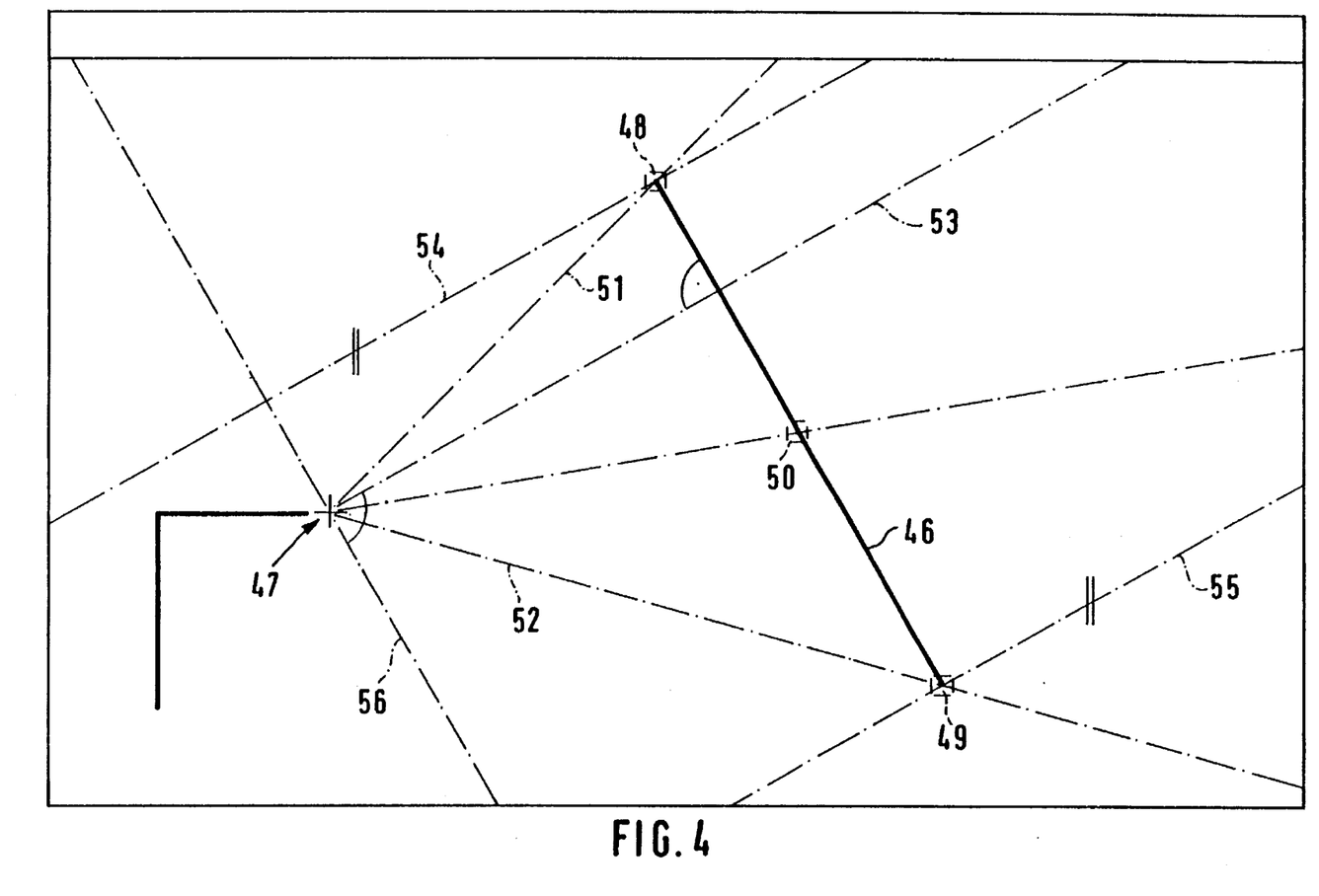
FIG. 4 shows a second example.

Another embodiment is shown in FIG. 4. In this case, the existing object is a finite straight line 46. The current cursor position is identified as 47. Singular points of line 46 are its two end points 48 and 49, as well as its midpoint 50.

In the case shown in FIG. 4, the CAD system proposes a multiplicity of possible geometric relations. These are, in particular:

1. two lines from the current cursor position to the two end points of straight line 46 (reference numbers 51, 52);
2. line through current cursor position 47 and perpendicular to straight line 46 (reference number 53);
3. line perpendicular to straight line 46 and passing through its end points 48 and 49 (reference numbers 54 and 55); and
4. line through current cursor position 47 and coilinear to straight line 46 (reference number 56).

It will be noted that only part of the proposed geometric relations are directly influenced by the current cursor position. Specifically, lines 54 and 55 are independent of the current position of the cursor.

Figure 5:
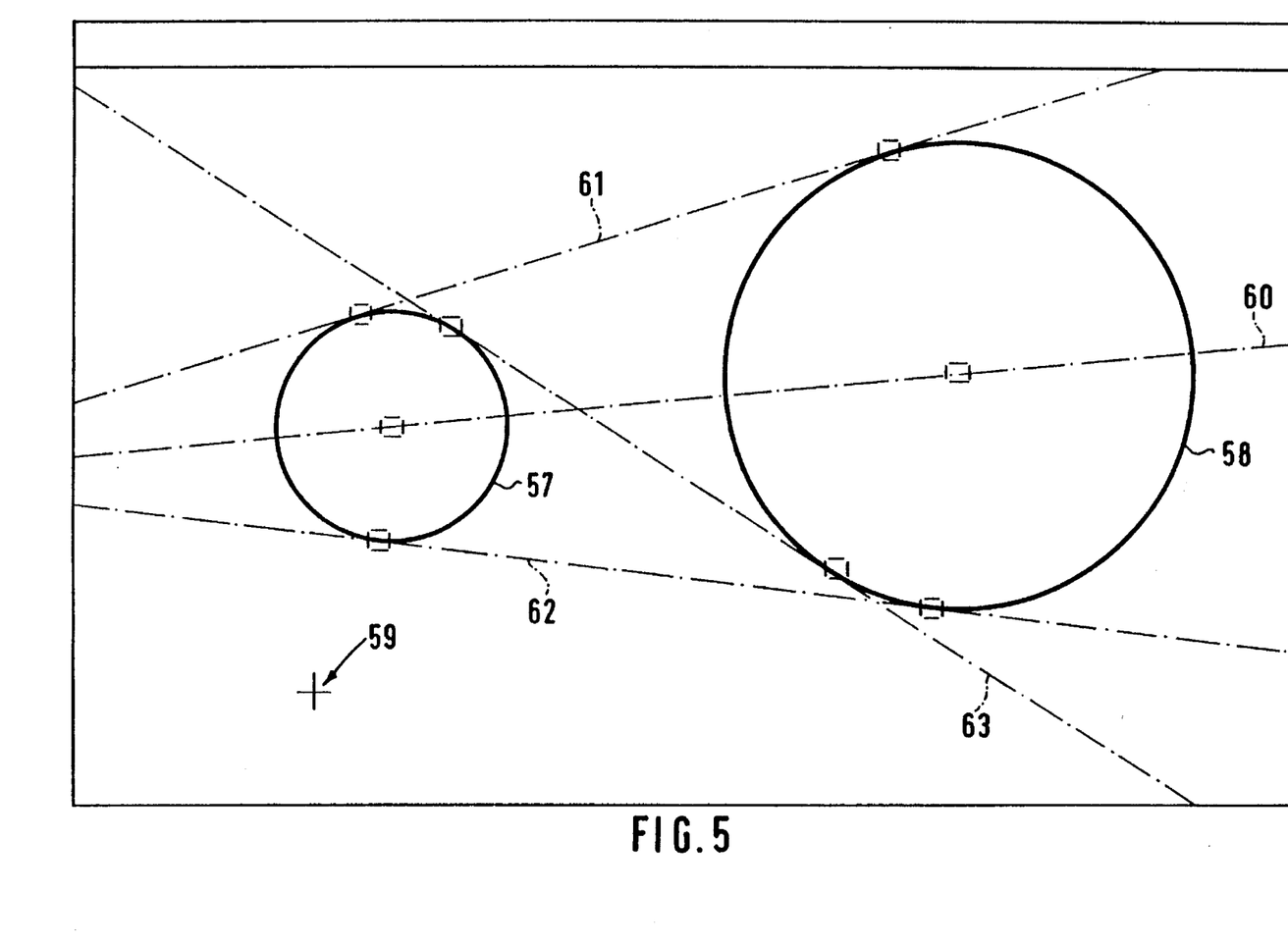
FIG. 5 is a third example, wherein more than one existing geometric object is taken into consideration.

Yet another embodiment is shown in FIG. 5. In this screen picture, two existing objects—namely circles 57 and 58—are considered, whereas the current cursor position is not of relevance (one could, of course, imagine to draw the geometric relations between the current cursor position 59 and the two circles 57 and 58 as well).

The geometric relations between circles 57 and 58 shown in FIG. 5 include:

1. line through the centers of both circles (reference number 60) and
2. three of the possible tangents between the two circles (reference numbers 61 to 63).

It will be noted that the singular points, namely the centers of the circles and the points where a tangent touches a circle, are drawn in FIG. 5 as well and illustrated as small boxes.

It should also be noted that the present invention, and the intended scope of protection of the following claims, is not limited to the presently preferred embodiments described above. Accordingly, many modifications and variations of the presently preferred embodiments will be encompassed by the following claims.
What is claimed:

1. Method for defining geometric relations in a computer aided design system, comprising the steps of:
   (a) identifying, retrieving or defining a geometric object;
   (b) identifying, retrieving or defining a cursor position;
   (c) generating at least one geometric relation between said cursor position and said geometric object, or between said geometric object and at least a second geometric object, wherein said geometric relations is or are of a type which is independent of said cursor position;
   (d) generating graphic representations of said cursor position, said geometric object or objects, and said geometric relation, and displaying said graphic representations on a display associated with a computer aided design system; and
   (e) entering a selection mode for accepting said geometric relation.

2. Method according to claim 1, wherein said step of generating graphic representations includes the step of marking said geometric relation in a graphic representation different from the graphic representations of said cursor position or said geometric object.

3. Method according to claim 2, further comprising the additional steps of identifying at least one singular point of said geometric object, generating a graphic representation thereof and feeding it to said display.

4. Method according to claim 3, wherein said geometric object is a straight line and said geometric relation is at least one of the following relations:
   (1) line between said cursor position and an endpoint of said straight line;
   (2) line between said cursor position and the midpoint of said straight line;
   (3) line perpendicular to said straight line and extending at least between said cursor position and said straight line;
   (4) line through said cursor position and extending parallel to said straight line.

5. Method according to claim 3, wherein said geometric object is a circle and said geometric relation is at least one of the following:
   (1) line through said cursor position and tangential to said circle;
   (2) line through said cursor position and the center of said circle.

6. Method according to claim 5, with at least two geometric objects, wherein said geometric relation is at least one of the following:
   (1) line through endpoints of two straight lines;
   (2) line through the midpoint of a straight line and an endpoint of another straight line;
   (3) line through the midpoints of two straight lines;
   (4) line perpendicular or parallel to a straight line and extending through an endpoint or the midpoint of another straight line;
   (5) line through the midpoint or an endpoint of a straight line and through the center of a circle;
   (6) line through the midpoint or an endpoint of a straight line and tangential to a circle;
   (7) line through the centers of two circles;
   (8) line through the center of a circle and tangential to another circle;
   (9) line tangential to two circles.

7. Method according to claim 1, further comprising the additional steps of identifying at least one singular point of said geometric object, generating a graphic representation of said singular point, and feeding it to said display.

8. Method according to claim 1, wherein said geometric object is a straight line and said geometric relation is at least one of the following relations:
   (1) line between said cursor position and an endpoint of said straight line;
   (2) line between said cursor position and the midpoint of said straight line;
   (3) line perpendicular to said straight line and extending at least between said cursor position and said straight line;
   (4) line through said cursor position and extending parallel to said straight line.

9. Method according to claim 1, wherein said geometric object is a circle and said geometric relation is at least one of the following:
   (1) line through said cursor position and tangential to said circle;
   (2) line through said cursor position and the center of said circle.

10. Method according to claim 1 with at least two geometric objects, wherein said geometric relation is at least one of the following:
    (1) line through endpoints of two straight lines;
    (2) line through the midpoint of a straight line and an endpoint of another straight line;
    (3) line through the midpoints of two straight lines;
    (4) line perpendicular or parallel to a straight line and extending through an endpoint or the midpoint of another straight line;
    (5) line through the midpoint or an endpoint of a straight line and through the center of a circle;
    (6) line through the midpoint or an endpoint of a straight line and tangential to a circle;
    (7) line through the centers of two circles;
    (8) line through the center of a circle and tangential to another circle;
    (9) line tangential to two circles.

11. Computer aided design system, comprising:
    (a) at least one user input interface;
    (b) a digital processor connected to said user input interface;
    (c) at least one display connected to said digital processor;
    (d) an object description memory containing data on already defined geometric objects;
    (e) a picture instruction memory for generating a pictorial representation of already defined geometric objects;
    (f) a cursor position memory; and
    (e) a preview instruction memory operatively connected with said digital processor, said preview instruction memory containing instructions for establishing predefined geometric relations between said cursor position and a geometric object, or between two geometric objects, wherein said geometric relation is of a type which is independent of said cursor position.

12. Computer aided design system according to claim 11, wherein said preview instruction memory contains instructions for identifying at least one singular point of a geometric object and for generating a pictorial representation of said singular point.

13. Computer aided design system according to claim 12, wherein said preview instruction memory contains instructions for generating a graphical representation of said predefined geometric relations different from the representation of said geometric objects.

14. Computer aided design system according to claim 11, wherein said preview instruction memory contains instructions for generating a graphical representation of said predefined geometric relations different from the representation of said geometric objects.

15. Computer aided design system, comprising:
 (a) means for identifying, retrieving or defining a geometric object;
 (b) means for identifying, retrieving or defining a cursor position;
 (c) means for generating at least one geometric relation between said cursor position and said geometric object, or between said geometric object and at least a second geometric object, wherein said geometric relations is or are of a type which is independent of said cursor position;
 (d) means for generating graphic representations of said cursor position, said geometric object or objects, and said geometric relation, and displaying said graphic representations on a display associated with a computer aided design system; and
 (e) means for entering a selection mode for accepting said geometric relation.

16. Computer aided design system according to claim 15, wherein said means for generating graphic representations includes means for marking said geometric relation in a graphic representation different from the graphic representations of said cursor position and/or said geometric object.

17. Computer aided design system according to claim 16, further comprising means for identifying at least one singular point of said geometric object, generating a graphic representation thereof and feeding it to said display.

18. Computer aided design system according to claim 17, wherein said geometric object is a straight line and said means for defining a geometric relation comprises means for defining at least one of the following relations:
 (1) line between said cursor position and an endpoint of said straight line;
 (2) line between said cursor position and the midpoint of said straight line;
 (3) line perpendicular to said straight line and extending at least between said cursor position and said straight line;
 (4) line through said cursor position and extending parallel to said straight line.

19. Computer aided design system according to claim 17, wherein said geometric object is a circle and said means for defining a geometric relation comprises means for defining at least one of the following:
 (1) line through said cursor position and tangential to said circle;
 (2) line through said cursor position and the center of said circle.

20. Computer aided design system according to claim 15, with at least two geometric objects, wherein said means for defining a geometric relation comprises means for defining at least one of the following:
 (1) line through endpoints of two straight lines;
 (2) line through the midpoint of a straight line and an endpoint of another straight line;
 (3) line through the midpoints of two straight lines;
 (4) line perpendicular or parallel to a straight line and extending through an endpoint or the midpoint of another straight line;
 (5) line through the midpoint or an endpoint of a straight line and through the center of a circle;
 (6) line through the midpoint or an endpoint of a straight line and tangential to a circle;
 (7) line through the centers of two circles;
 (8) line through the center of a circle and tangential to another circle;
 (9) line tangential to two circles.

* * * * *